(12) United States Patent
Theuss

(10) Patent No.: US 7,851,829 B2
(45) Date of Patent: Dec. 14, 2010

(54) SEMICONDUCTOR CHIP MODULE

(75) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 152 days.

(21) Appl. No.: 11/676,372

(22) Filed: Feb. 19, 2007

(65) Prior Publication Data

US 2008/0185673 A1 Aug. 7, 2008

(30) Foreign Application Priority Data

Feb. 5, 2007 (DE) .................. 10 2007 005 630

(51) Int. Cl.
*H01L 29/84* (2006.01)
*H01L 27/14* (2006.01)
(52) U.S. Cl. .............. 257/254; 257/414; 257/E23.001
(58) Field of Classification Search ............ 257/414, 257/417, 418, 444, 678, 698, 433, 620, 692, 257/787, 686, 685, 777, 723, 691, 660, 687, 257/690, 709, 730, 731, 734, 735, E23.001, 257/E23.031, E23.06, E23.104, E23.141; 438/54, 64, 106, 111, 142, 309, 465, 478; 73/493, 866.1, 861.357; 439/71; 174/52.2, 174/256, 525; 701/36
See application file for complete search history.

(56) References Cited

U.S. PATENT DOCUMENTS

| | | | | |
|---|---|---|---|---|
| 4,089,575 | A | * | 5/1978 | Grabbe .................. 439/71 |
| 5,817,941 | A | * | 10/1998 | Stalnaker et al. ............ 73/493 |
| 6,035,712 | A | * | 3/2000 | Ohta et al. ................. 73/493 |
| 6,541,833 | B2 | * | 4/2003 | Werner et al. ............... 257/419 |
| 6,624,508 | B2 | * | 9/2003 | Koh ......................... 257/692 |
| 6,713,677 | B2 | * | 3/2004 | Fischbach et al. ........... 174/536 |
| 6,927,572 | B2 | * | 8/2005 | Motz ......................... 324/250 |
| 2002/0096730 | A1 | * | 7/2002 | Tu et al. .................... 257/433 |
| 2005/0046044 | A1 | * | 3/2005 | Theuss ...................... 257/787 |
| 2006/0001116 | A1 | * | 1/2006 | Auburger et al. ............ 257/433 |
| 2006/0049477 | A1 | * | 3/2006 | Arndt et al. ................. 257/433 |
| 2006/0053909 | A1 | * | 3/2006 | Shirasaka et al. .......... 73/866.1 |
| 2006/0113107 | A1 | * | 6/2006 | Williams .................... 174/256 |
| 2006/0278958 | A1 | * | 12/2006 | Pueschner et al. .......... 257/620 |
| 2007/0288139 | A1 | * | 12/2007 | Schillinger et al. ............ 701/36 |

FOREIGN PATENT DOCUMENTS

| | | |
|---|---|---|
| DE | 42 03 832 C2 | 6/1996 |
| DE | 19800928 | 4/1999 |
| DE | 199 29 025 A1 | 12/2000 |
| DE | 10064170 * | 11/2002 |
| DE | 102004019428 | 8/2005 |
| DE | 10 2004 058 815 | 6/2006 |
| EP | 0557917 | 9/1993 |
| JP | 2005026584 | 1/2006 |

OTHER PUBLICATIONS

A German Office Action for German Application No. 10 2007 005 630.5 mailed Oct. 26, 2007.

* cited by examiner

*Primary Examiner*—Lynne A Gurley
*Assistant Examiner*—Galina Yushina
(74) *Attorney, Agent, or Firm*—Dicke, Billig & Czaja, PLLC

(57) ABSTRACT

One aspect includes a sensor chip module including a sensor chip and a module housing accommodating the sensor chip. The module housing defines a mounting plane of the sensor chip module. In one case, an active surface of the sensor chip is inclined with respect to the mounting plane of the sensor chip module.

13 Claims, 10 Drawing Sheets

SEMICONDUCTOR CHIP MODULE

CROSS-REFERENCE TO RELATED APPLICATIONS

This Utility Patent Application claims priority to German Patent Application No. DE 10 2007 005 630.5 filed on Feb. 5, 2007, which is incorporated herein by reference.

BACKGROUND

Embodiments of the invention relate to modules containing a semiconductor chip.

Semiconductor modules are known in the art whose functionality depends on the orientation of the semiconductor chip with regard to the three spatial directions. Examples thereof are, inter alia, sensors or transmitters with directional emission. These include optical sensors and transmitters and, for example, also motion sensors (e.g. acceleration sensors) which, in a manner conditional on the design and depending on the orientation of the sensor spatially, detect movements in the different spatial directions with varying response characteristics.

Sensor chips are typically incorporated into a semiconductor housing in planar fashion, the active surface of the sensor chip lying parallel to the mounting plane of the semiconductor housing on an application board. If the intention is to achieve a different orientation of the sensor chip with respect to the application board, the sensor chip module is usually mounted onto a small auxiliary printed circuit board, which is then fitted to the application board in the desired orientation (e.g. perpendicular). This is associated with a relatively high outlay in respect of mounting.

SUMMARY

One aspect of the invention provides a sensor chip module including a sensor chip and a module housing accommodating the sensor chip. The module housing defines a mounting plane of the sensor chip module. An active surface of the sensor chip is inclined with respect to the mounting plane of the sensor chip module.

According to another aspect, provision is made of a module, including a first semiconductor chip having an active surface, said semiconductor chip being accommodated in a first housing, and a second semiconductor chip accommodated in a second housing. The module furthermore has a common chip carrier, on which the first semiconductor chip and the second semiconductor chip are applied. The two housings are joined together to form a common module housing, which defines a mounting plane of the module. The chip carrier is bent in such a way that the active surface of the first semiconductor chip is inclined with respect to the mounting plane.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A description is given below of modules having a semiconductor chip whose active surface is inclined, i.e. does not run parallel, with respect to the mounting plane of the module. In this case, the semiconductor chip may be of a wide variety of types. By way of example, it may contain electromechanical or electro-optical functional elements in the region of its active surface. It may be realized in the form of a sensor chip or an emitter with directional emission. Examples in the optical field are photodiodes or diode lasers. A sensor chip may be embodied as a so-called MEMS (Micro-Electro-Mechanical System), i.e. microelectronic mechanical system, wherein micromechanical movable structures such as, for example, bridges, membranes or reed structures may be provided. Such sensor chips may be motion sensors, in particular, which may be embodied as acceleration sensors (which detect accelerations in different spatial directions), or rotation sensors. Sensors of this type are also referred to as gyrosensors, roll-over sensors, impact sensors, inertial sensors, etc. and are used for example in the automotive industry for signal detection in ESP (Electronic Stability Program) systems, ABS (Anti-lock Braking Systems), airbags and the like.

Semiconductor modules into which such functional elements are embedded generally include electronic circuits which serve for driving the functional elements or process further signals that are generated by the functional elements. Such electronic circuits may be implemented either on the semiconductor chip forming the functional element or on a separate semiconductor chip integrated into the module. By way of example, in the case of a motion sensor, the deflection of a movable micro-functional element may be read piezoresistively or capacitively and be processed further in such electronic circuits. The separate semiconductor chip may be embodied for example as an ASIC (Application Specific Integrated Circuit) and have e.g. an RF (Radio-Frequency) functionality for wireless signal forwarding.

Figure 1:
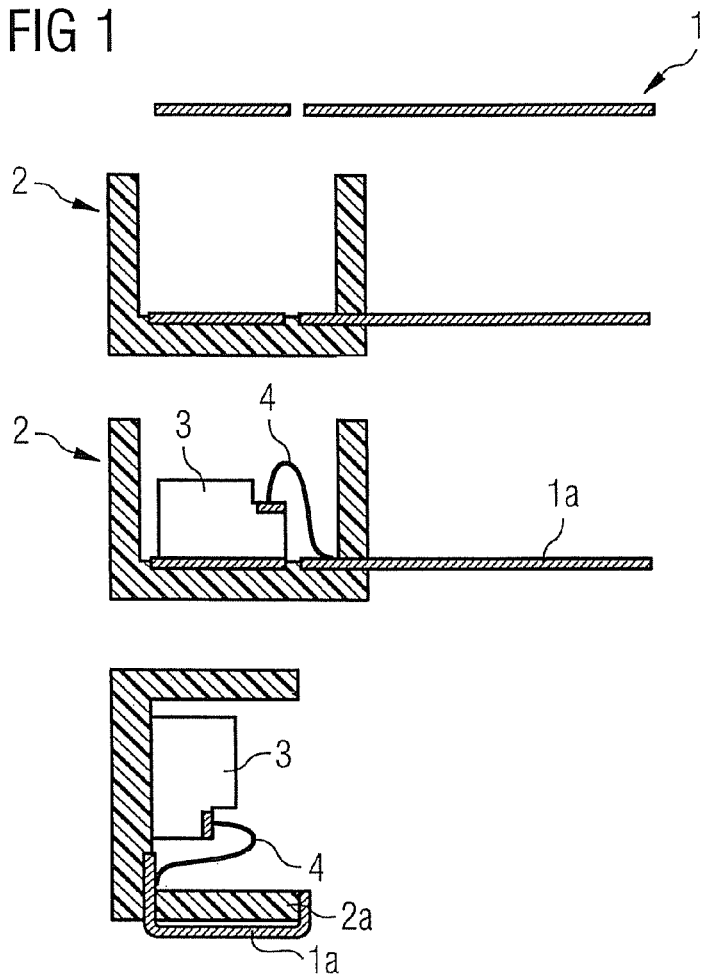
FIG. 1 illustrates schematic sectional illustrations of a sensor chip module in different process steps of production.
Figure 2:
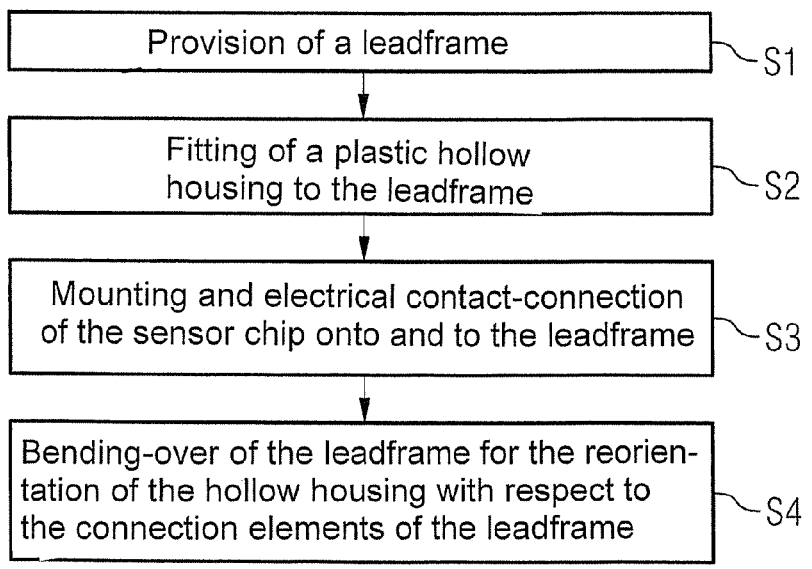
FIG. 2 illustrates a flow chart for elucidating the production sequence of a sensor chip module.

FIGS. 1 and 2 relate to production steps for producing such a semiconductor module using the example of a sensor chip module (e.g. motion sensor). The starting point for production is, by way of example, a flat, unbent metallic leadframe 1, as it is called in the art, see step S1 in FIG. 2. The area plane of the leadframe 1 is parallel to the later mounting plane of the sensor chip module.

A leadframe 1 of this type can be produced for example by stamping or etching from a thin metal layer (the thickness of the metal layer may be e.g. within the range of 0.1 mm to a few millimeters) of a metal strip. Leadframes, as interconnection frames, serve both as chip carriers and for realizing the leads for the external contact-connection of the sensor chip module. On account of the high reliability of modules with leads, modules produced on a leadframe basis are used to a great extent in the automotive industry.

In a next step S2, a hollow housing 2 is fitted to the leadframe 1. The hollow housing 2 is typically produced prior to the mounting of the sensor chip by plastic injection-moulding encapsulation of the leadframe 1. After the leadframe 1 has been encapsulated by injection moulding, the plastic hollow housing 2 is fixedly connected to the leadframe 1.

In a next step S3, a sensor chip 3 is inserted into the hollow housing 2, mounted onto the leadframe 1 and electrically connected to connection elements 1a of the leadframe 1. The sensor chip 3 can be mounted onto the leadframe 1 by means of adhesive bonding or soldering, by way of example. In accordance with FIG. 1, the electrical contact-connection of the sensor chip 3 can be performed by means of bonding wires 4 extending from the active surface of the sensor chip 3 to the connection elements 1a. Another possibility consists in using flip-chip technology for the electrical contact-connection of the sensor chip 3, in which technology the active surface of the sensor chip 3 faces the leadframe 1 and the electrical contact-connection between the sensor chip 3 and the connection elements 1a of the leadframe 1 is realized by means of solder elements (solder bumps) (step S3).

After the mounting and the contact-connection of the sensor chip 3 onto and to the leadframe 1, the sensor chip 3 can be potted with a soft gel (e.g. silicone gel) in the hollow housing 2 for reliability reasons (not illustrated in FIGS. 1 and 2).

A bending-over step is effected later, in the course of which the hollow housing 2 is folded over with respect to the leadframe 1 in such a way that the sensor chip 3 attains a position that is tilted with respect to the connecting elements 1a of the leadframe 1. In particular, 90° tilting may be performed, as illustrated in FIG. 1, with the result that the active surface of the sensor chip 3, which originally ran parallel to the leadframe plane, is now perpendicular to said plane (step S4).

The mounting of the sensor chip module onto an application board (not illustrated), e.g. a printed circuit board composed of epoxy resin or some other metallized support, is effected by means of the connection elements 1a. What is achieved owing to the preceding leadframe bending step is that, unlike in the case of a customary "horizontal" mounting of the sensor chip module onto the application board, the sensor chip is oriented in a manner inclined with respect to the plane of the application board (not illustrated). In this case, the mounting plane of the sensor chip module in FIG. 1 is predefined by the lower housing wall 2a (that is to say the base area or the bottom of the sensor chip module during the placement operation on the application board), and hence by the connection elements 1a of the leadframe 1 that run parallel thereto. The desired capability of perpendicular placement of the sensor chip module on the application board thus remains ensured.

What is achieved by the bending-over of the leadframe 1 for the reorientation of the hollow housing 2 with respect to the connection elements 1a of the leadframe 1 is that during placement on an application board, the sensor chip 3 is automatically mounted in a position on the application board in which its active surface and the functional elements formed e.g. in micromechanical fashion therein do not run parallel to the mounting plane of the sensor chip module.

Figure 3:
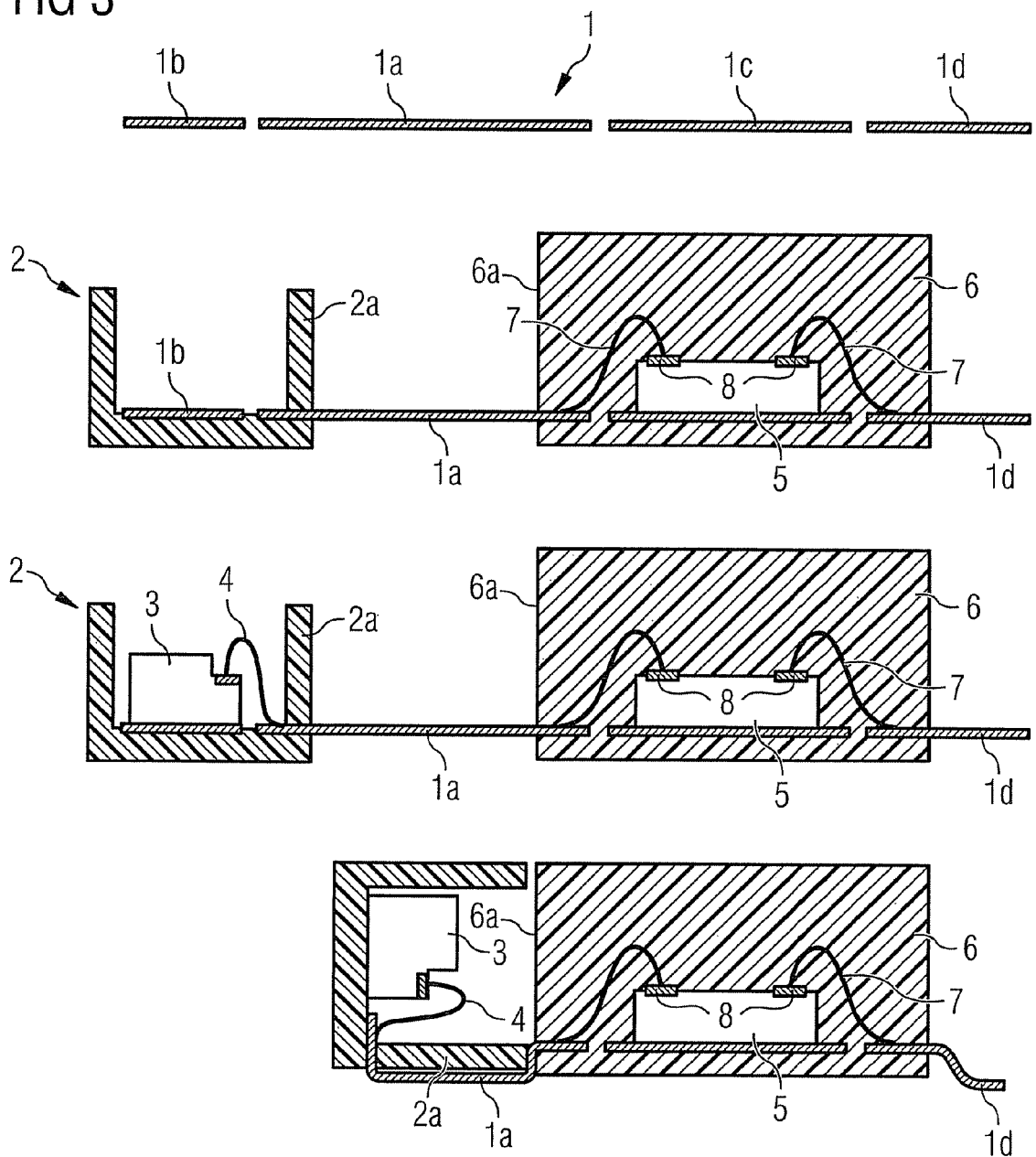
FIGS. 3 to 7 illustrate schematic sectional illustrations of sensor chip modules in different process steps of production.

FIG. 3 shows illustrations of a production sequence of a sensor chip module comprising a hollow housing 2 with a sensor chip 3 contained therein and also a semiconductor chip 5 in a semiconductor chip housing 6. The same reference symbols as in FIG. 1 are used to designate identical or functionally similar parts.

The starting point of the production sequence is once again a planar, unbent leadframe 1 including e.g. a plurality of sections 1a, 1b, 1c and 1d. The section 1b serves as a chip carrier for the sensor chip 3 and the section 1c serves as a chip carrier for the semiconductor chip 5. As can be seen from FIG. 3, the section 1d leads out of the semiconductor chip housing 6 and, after a bending step, constitutes a lead in the finished sensor chip module (bottom illustration in FIG. 3). The section 1a, which realizes the connection element for the sensor chip 3, likewise leads, as already shown in FIG. 1, out of the module (more precisely: out of the hollow housing 2 of the module) and can likewise be utilized for external connection purposes.

The sensor chip module shown in FIG. 3 is produced as follows:

Firstly, the planar leadframe 1 having the abovementioned leadframe sections 1a, 1b, 1c, 1d is produced. In accordance with a first possible method sequence, the semiconductor chip 5 is mounted (e.g. adhesively bonded or soldered) onto the leadframe 1 and is electrically contact-connected thereto. The electrical contact-connection thereto may be effected e.g. by means of bonding wires 7 which connect pads 8 on the active surface of the semiconductor chip 5 to the connection elements 1a and 1d of the leadframe 1. Other mounting and contact-connection techniques, e.g. the flip-chip technique, are likewise possible.

The leadframe 1 with the semiconductor chip 5 mounted thereon and contact-connected thereto is then introduced into an injection mould having two cavities for the production of the hollow housing 2 and of the semiconductor chip housing 6. Therefore, the two housings 2 and 6 are in one example injection-moulded onto the leadframe 1 in one workstep. After the injection-moulding operation, the semiconductor chip 5 is completely housed.

As an alternative, it is also possible for the semiconductor chip 5 to be mounted onto and electrically contact-connected to the leadframe 1 only after the encapsulation of the leadframe 1 by injection moulding. In this case, the semiconductor chip housing 6 is likewise a hollow housing (comparable to the hollow housing 2) into which the semiconductor chip 5 is subsequently introduced. This embodiment variant with two housings 2, 6 having SMD (Surface Mounted Device) placement capability is explained later with reference to FIG. 6.

Since the semiconductor chip 5 typically does not contain a sensor system but rather functions as a driver chip or evaluation chip for the sensor chip 3, the semiconductor chip 5 is generally insensitive to mechanical strains and can therefore be encapsulated with a plastic solid housing 6 by injection moulding in accordance with the first production variant.

Afterwards, as already explained with reference to FIG. 1, the sensor chip 3 is inserted into the hollow housing 2.

The completed sensor chip module after the bending-over step has been carried out can be discerned in the bottommost illustration in FIG. 3. During the bending-over step, the section 1*a* of the leadframe 1, which section leads out of the hollow housing 2 of the sensor chip 3, is bent over at three locations, whereby the active surface of the sensor chip 3 is inclined (here at 90°) with respect to the plane of the section 1*a*. In this case, apart from its region projecting into the hollow housing 2, the section 1*a* continues to remain in the same plane as the leadframe sections 1*c* and 1*d*, that is to say in that plane which the leadframe 1 had during its planar population with the semiconductor chip 5 and the sensor chip 3 and which simultaneously constitutes the mounting plane of the completed sensor chip module.

As can be discerned in the bottommost illustration in FIG. 3, the hollow housing 2 is closed off ("capped") during the bending-over step by virtue of the opening of the hollow housing 2 being covered by a side wall 6*a* of the semiconductor chip housing 6. The reorientation of the sensor chip 3 and the closing of the hollow housing 2 can thus be effected in an elegant manner in the same workstep. The sensor chip housing 2 and the semiconductor chip housing 6 are then fixedly joined together e.g. by adhesive bonding, welding or latching and are typically connected to one another in an unreleasable manner.

In a further step, the leadframe sections 1*d* are bent over in such a way that they form leads of the sensor chip module. The leads of the sensor chip module are utilized as external contacts for the electrical contact-connection of the sensor chip module on an application board (not illustrated). As can be gathered from FIG. 3, the sensor chip module constructed from the housings 2 and 6 can be mounted on the application board in a conventional manner with leadframe sections 1*a*, 1*d* running parallel to the mounting plane and semiconductor chip 5 oriented parallel to the mounting plane, the sensor chip 3 being oriented perpendicular (or at an angle of inclination other than 90°) with respect to the mounting plane of the sensor chip module (that is to say the base or bottom area of the sensor chip module relative to the placement operation on the application board). One advantage is that the reorientation of the sensor chip 3 is effected in the sensor chip module housing (package) and the sensor chip module housing can be mounted onto the application board in a conventional manner. In other words, additional measures (e.g. the mounting of the sensor chip module housing on an auxiliary printed circuit board which is fixed perpendicularly to the application board), as are required in known solutions, are obviated.

Figure 4:
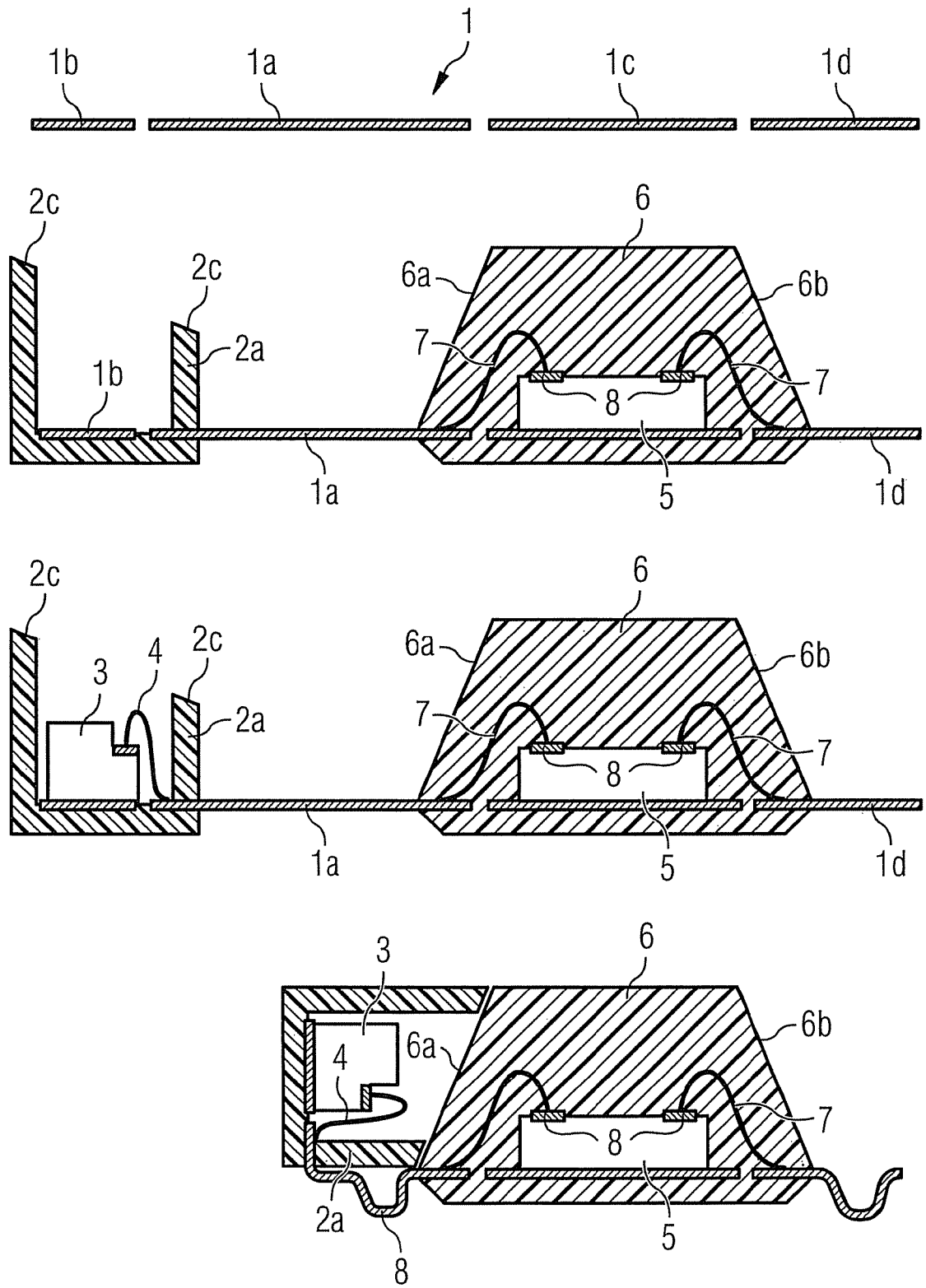

FIG. 4 shows an exemplary embodiment which differs from the exemplary embodiment illustrated in FIG. 3 by virtue of the fact that the semiconductor chip housing 6 has bevelled wall areas 6*a* and 6*b*, and that free end areas 2*c* of the hollow housing 2 are likewise realized as corresponding oblique areas. The bevelling of the side wall areas 6*a*, 6*b* facilitates the encapsulation of the leadframe 1 by injection moulding, particularly when thermosetting plastics are used as plastic material, since, as mould release bevels, they facilitate the opening of the injection mould after the plastic has cured.

FIG. 4 furthermore shows that the hollow housing 2 can be dimensioned such that the bottom-side housing wall 2*a* is spaced apart vertically from the bottom of the semiconductor chip housing 6. This makes it possible to produce the section 1*a* of the leadframe 1, which section runs outside the hollow housing 2, with a U-shaped outwardly bent portion 8, which can be utilized as an external contact during the placement of the sensor chip module on an application board. If no outwardly bent portion 8 is provided, the spacing-apart—present in the exemplary embodiment illustrated in FIG. 4—of the housing wall 2*a* from the application board (not illustrated) may have the effect that no inadvertent electrical connection can arise between the section 1*a* of the leadframe 1, which section runs on the exterior side of the housing, and electrical structures on the application board.

Figure 5:
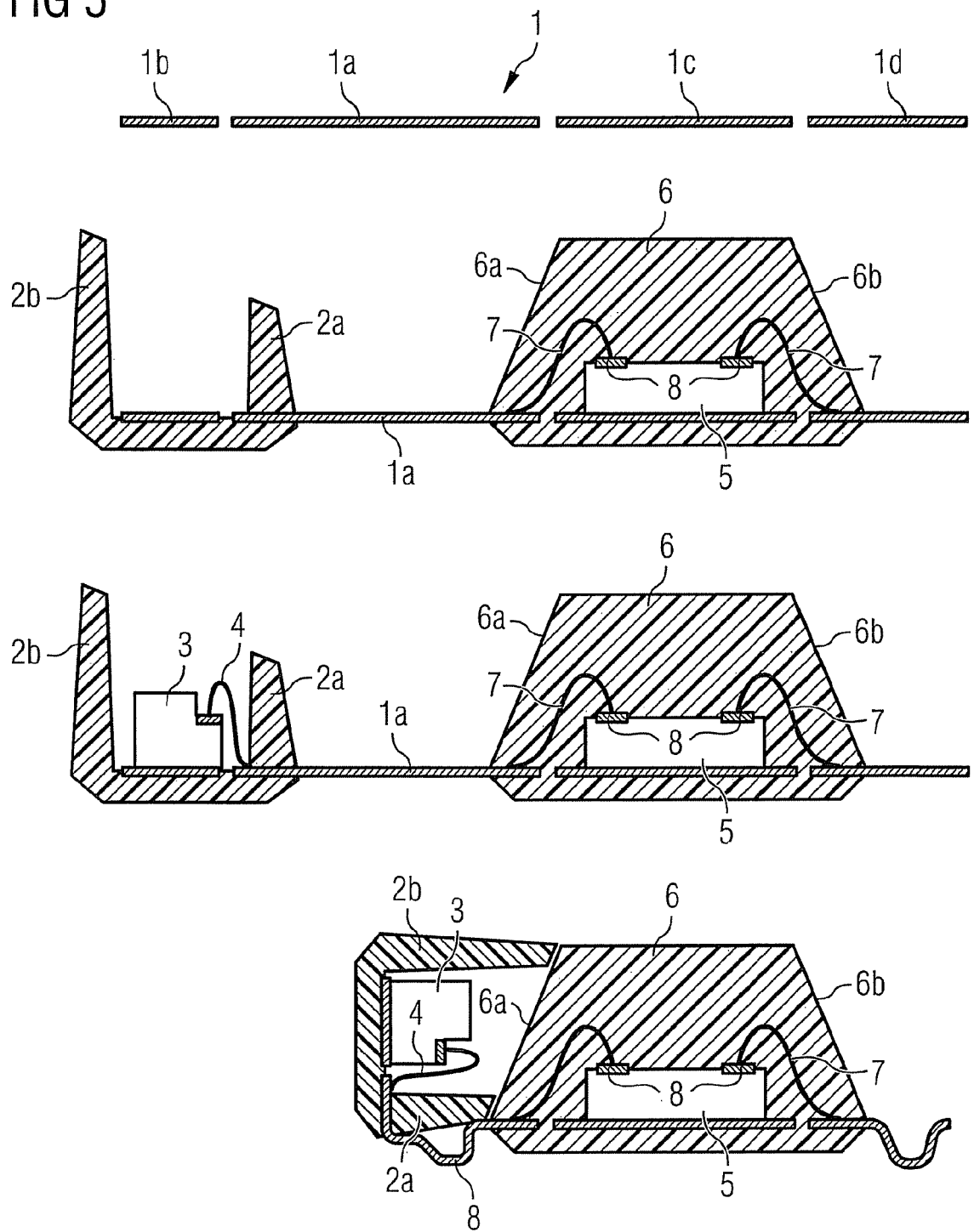

FIG. 5 shows a further exemplary embodiment, which differs from the exemplary embodiment illustrated in FIG. 4 essentially merely by virtue of the fact that here the side walls 2*a*, 2*b* of the hollow housing 2 are also equipped with mould release bevels for facilitating the removal of the injection-moulding product from the injection mould.

Figure 6:
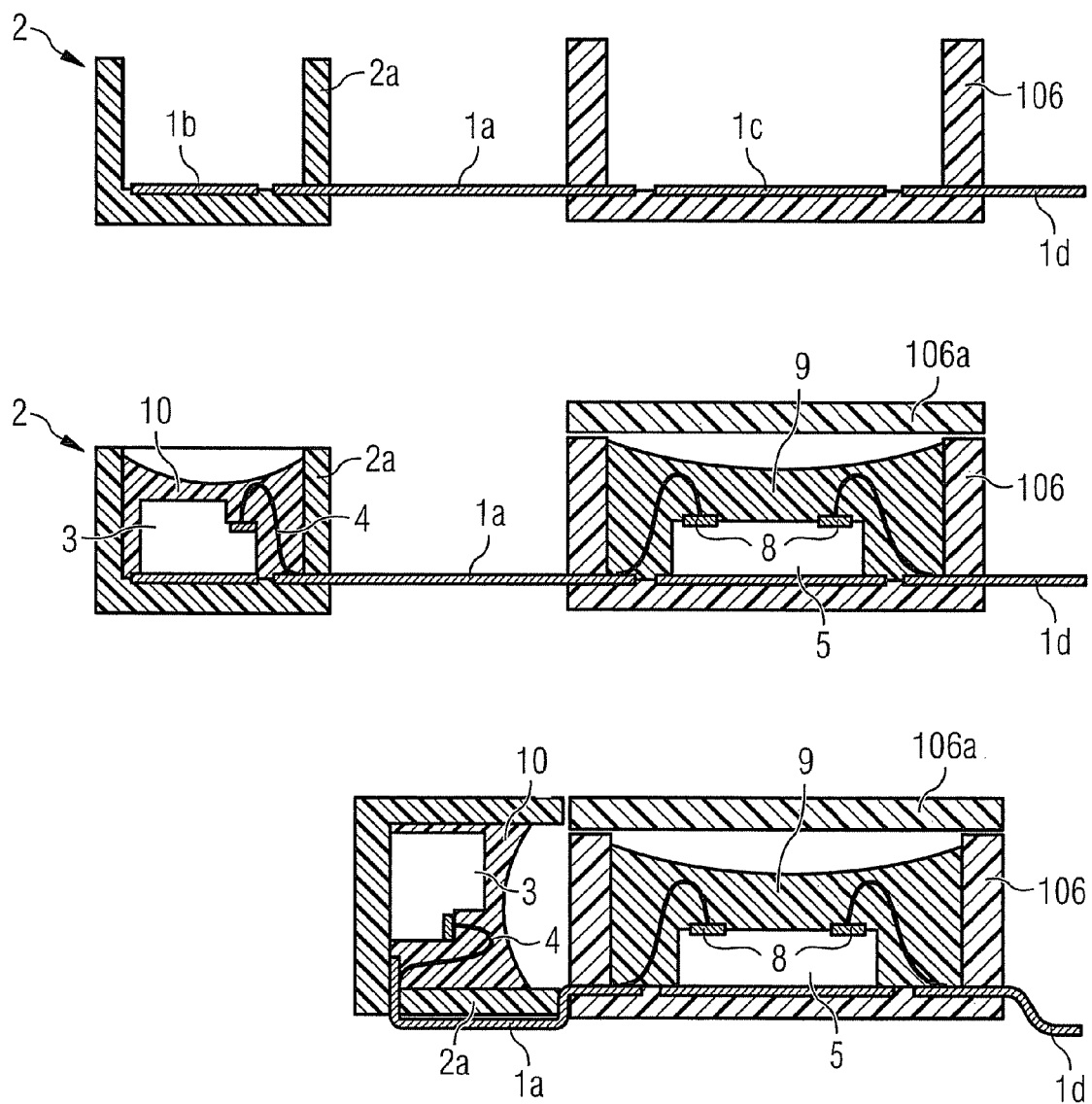

FIG. 6 shows a further exemplary embodiment, in which the semiconductor chip housing is also embodied as a hollow housing 106. In this case, the semiconductor chip 5 can be mounted onto and electrically contact-connected to the leadframe 1 after the injection-moulding step (in which both hollow housings 2 and 106 are produced simultaneously), as already discussed. Furthermore, the possibility arises of also embedding the semiconductor chip 5 into a potting composition 9, for example a gel, which may be different from the material of the hollow housing 106. This is advantageous if the semiconductor chip 5 or the electrical contact-connection thereof (e.g. the bonding wires 7) are also sensitive to strains or the forces occurring during the injection-moulding operation.

After the semiconductor chip 5 has been embedded into the potting composition 9, the hollow housing 106 is closed off by a cap 106*a*. The closure of the hollow housing 2 with the sensor chip 3 contained therein is once again effected by means of the bending-over step. FIG. 6 furthermore illustrates the possibility of accommodating the sensor chip 3 in a loading-absorbing potting composition 10 (e.g. gel, in particular silicone gel) in order to obtain a low stress die attach). This possibility arises in all exemplary embodiments in which the sensor chip 2 is inserted into a hollow housing 2. Furthermore, the configurations explained in the previous figures can be combined with the features of the module shown in FIG. 6.

Figure 7:
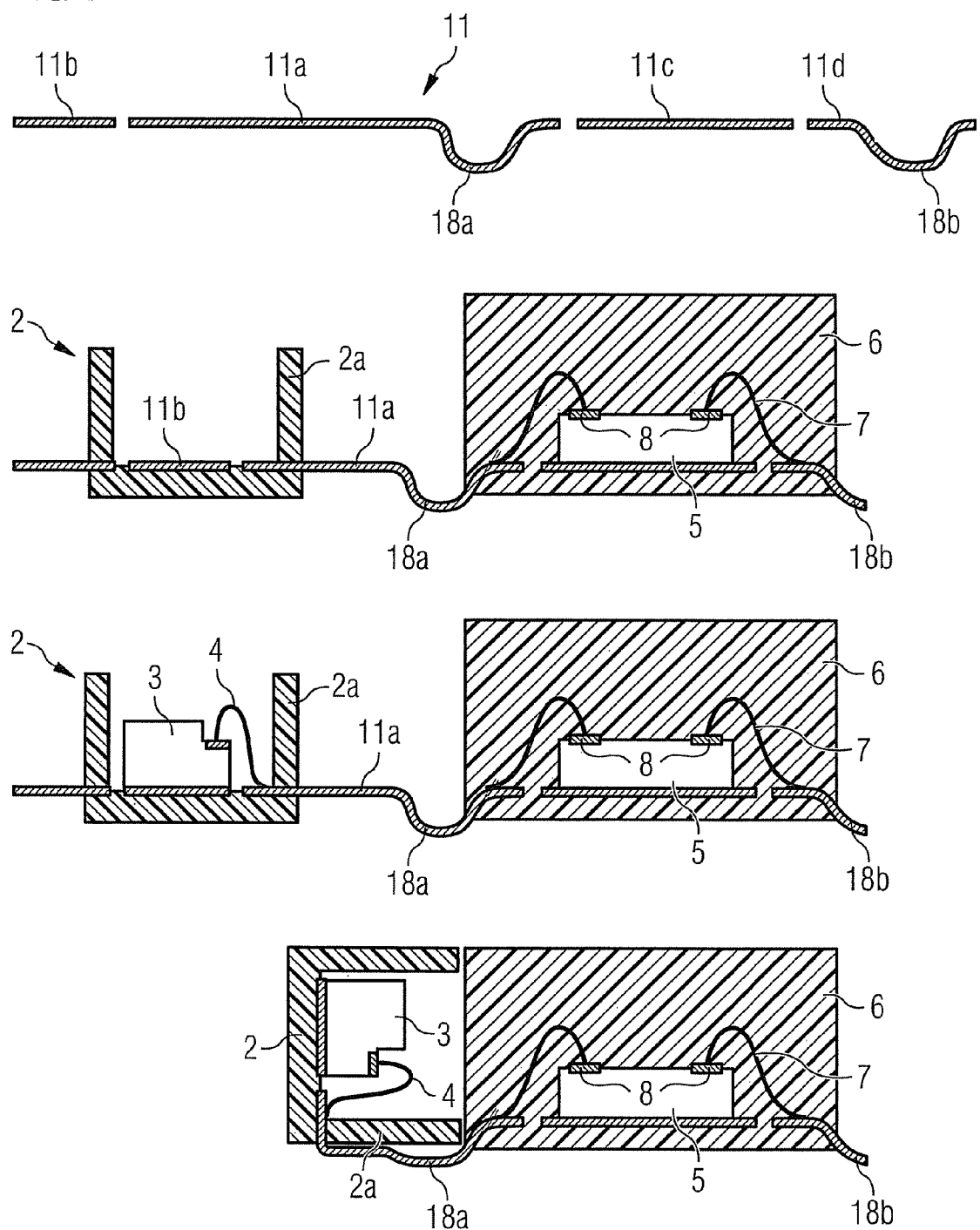

FIG. 7 shows the production steps of a sensor chip module when using a pre-bent leadframe 11. The pre-bent leadframe 11 has the sections 11*a*, 11*b*, 11*c*, 11*d*, corresponding to the sections 1*a*, 1*b*, 1*c*, 1*d* in the previous FIGS. 3 to 6. The leadframe section 11*a* projecting from the hollow housing 2 for the sensor chip 3 is provided with a U-shaped outwardly bent portion 18*a*, and the end section 11*d* protruding from the semiconductor chip housing 6 likewise has such a U-shaped outwardly bent portion 18*b*. In this case, the outwardly bent portion 18*a* has the effect that a part of the leadframe section 11*a* which extends along the housing wall 2*a* of the hollow housing 2 is situated somewhat away from the housing wall 2*a* and can be used as the lead for the mounting of the sensor chip module on the application board (not illustrated). The exterior side of the housing wall 2*a* can run flush with the bottom of the semiconductor chip housing 6. The outwardly bent portion 18*b* likewise realizes a contact lead of the completed sensor chip module, see bottom illustration in FIG. 7.

Figure 8:
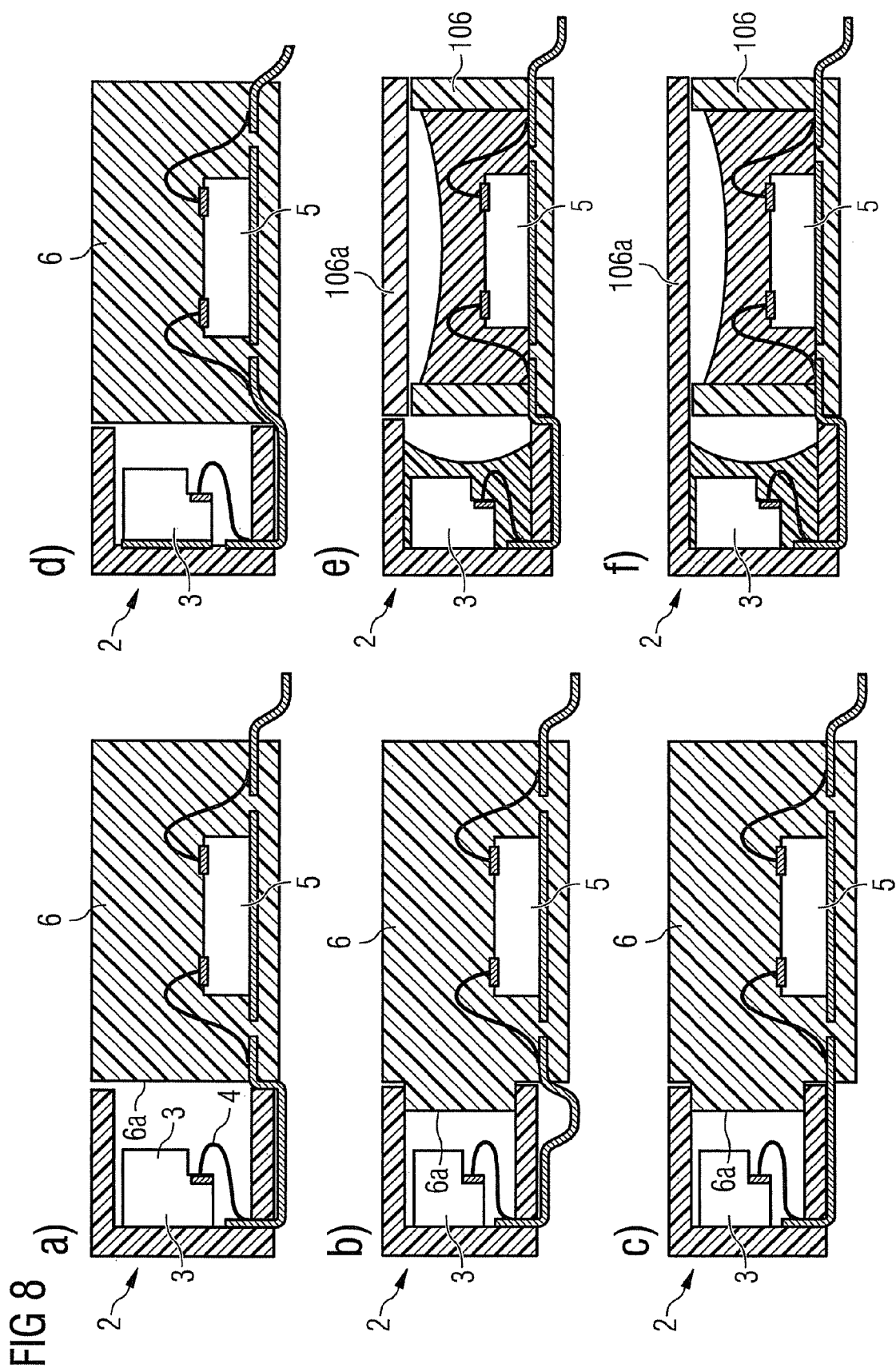
FIGS. 8 and 9 illustrate further exemplary embodiments of sensor chip modules in schematic sectional illustrations.

FIG. 8 shows further possibilities for the realization of the sensor chip module in the illustrations a to f. It becomes clear that the hollow housing 2 for the sensor chip 3 can be both unfilled (a to d) and filled with a gel (e and f). As already discussed, the semiconductor chip housing 6 can be embodied either as a solid housing (a to d) or as a hollow housing (e and f). In the illustrations b and c, the side wall 6*a* of the semiconductor chip housing 6, which side wall faces the hollow housing 2, has a pin-type projection which engages into the opening of the hollow housing 2 and thereby enables a mechanically stable plug connection of the hollow housing 2 at the semiconductor chip housing 6. In this case, in the illustrations b and c in FIG. 8, the housing wall 2a is vertically spaced apart with respect to the mounting plane defined by the bottom of the semiconductor chip housing 6.

The housing variants illustrated in FIG. 8 do not have mould release bevels and are therefore suitable rather for the use of thermoplastics as housing material. Suitable thermoplastics are liquid-crystalline polymers, also referred to as LC (liquid crystal) polymers.

Figure 9:
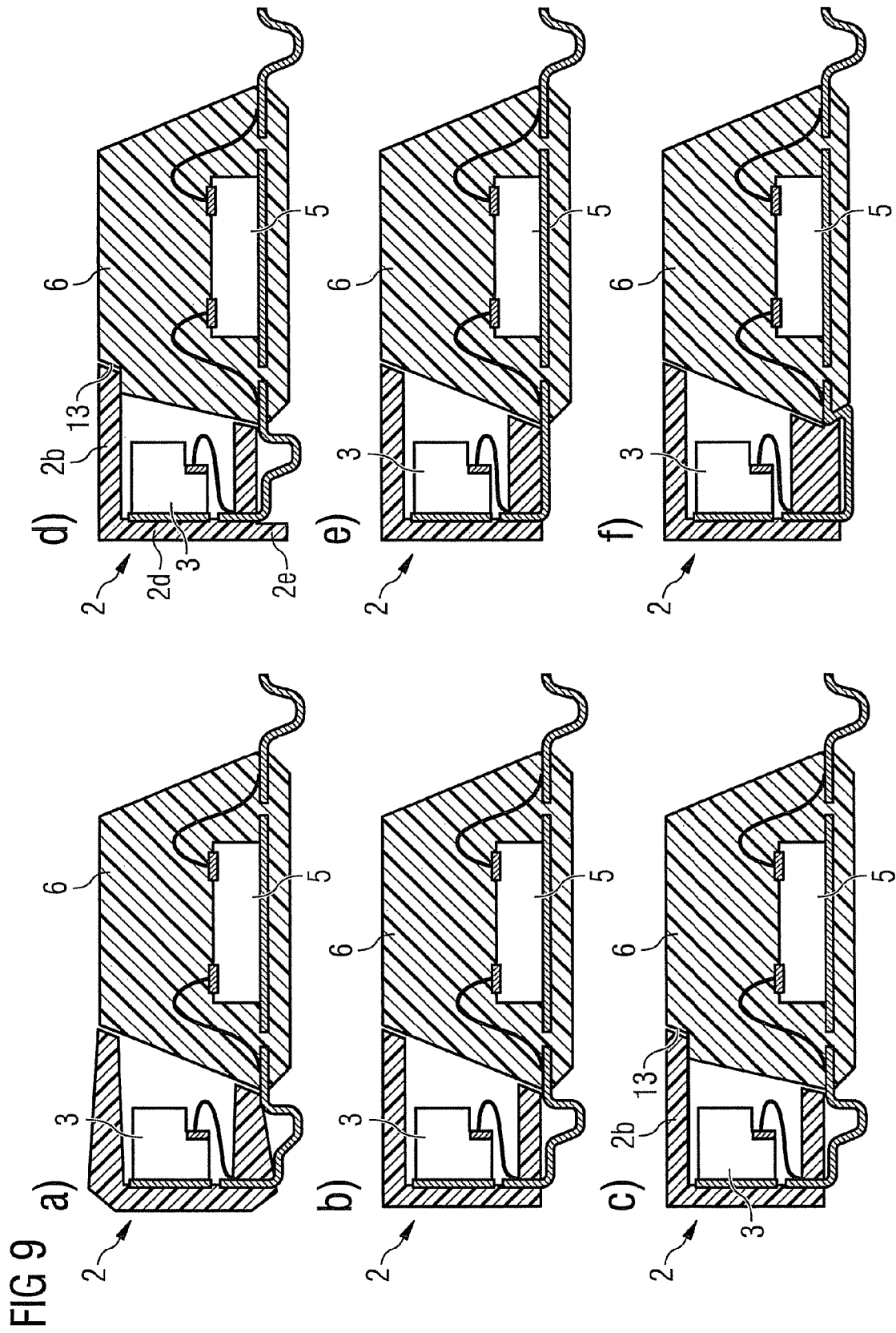

FIG. 9 shows illustrations a to f of sensor chip modules having mould release bevels on the semiconductor chip housing 6 and in part also the sensor chip housing 2. These housing variants are suitable particularly for the use of thermosetting plastics—for example epoxy resin—as housing material. As constructive special features, the exemplary embodiments shown in the illustrations c and d have a stepped cut-out 13 in the upper region of the semiconductor chip housing 6, into which cut-out the side wall 2c of the sensor chip housing 2 engages, whereby the fixing stability can be improved. Furthermore, the illustration d in FIG. 9 shows that a wall 2d of the sensor chip hollow housing 2 can have an overhang 2e which can be used for supporting the sensor chip hollow housing 2 on the application board (not illustrated) e.g. for safeguarding the interspace between the wall 2a and the application board. It is pointed out that a multiplicity of further exemplary embodiments emerge from combinations of features illustrated in FIGS. 1 and 3 to 9.

Figure 10:
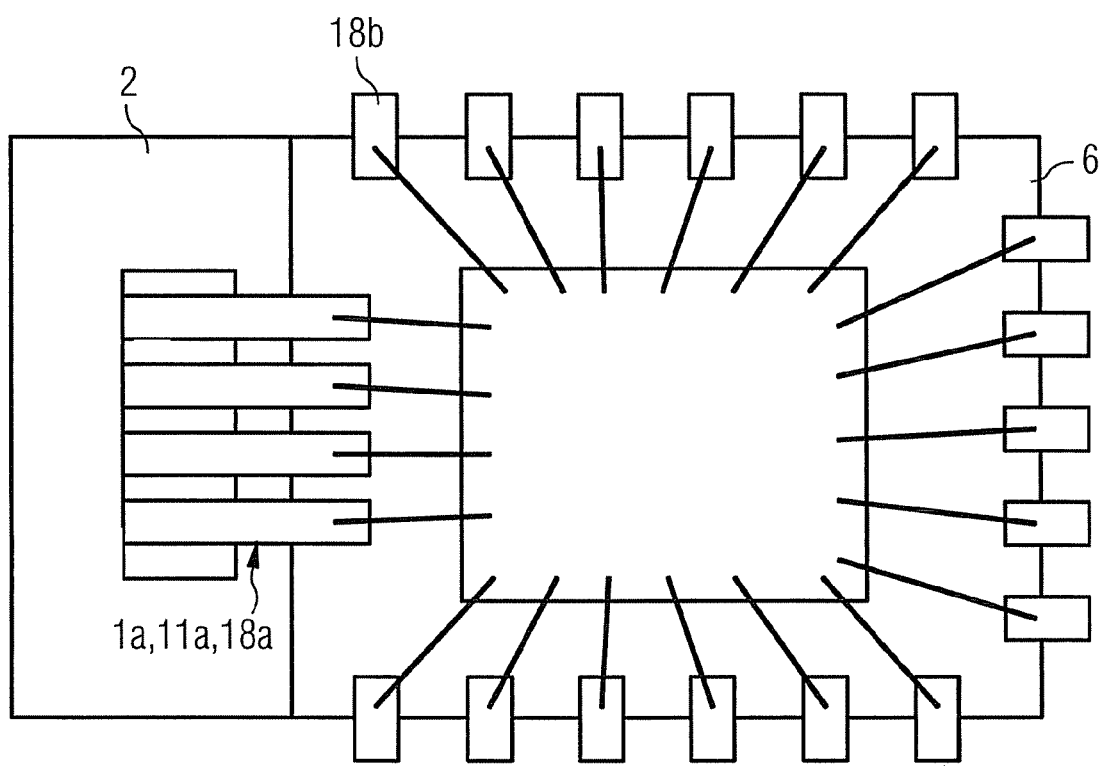
FIG. 10 illustrates a schematic plan illustration of the sensor chip modules in accordance with FIGS. 3 to 9.

FIG. 10 shows a footprint of the sensor chip modules illustrated in FIGS. 3 to 9. The leads 18b formed from the leadframe sections 1d or 11d can extend along the free outer periphery (three sides) of the semiconductor chip housing 6. The conductor elements emerging from the leadframe section 1a or 11a extend from the semiconductor chip housing 6 into the sensor chip hollow housing 2 and run below the housing wall 2a. They may be realized e.g. in the form of outwardly bent portions 18a as leads. As already explained with reference to FIGS. 3 to 9, in some variants the leadframe section 1a, 11a does not, however, constitute a location which has to be electrically contact-connected to corresponding mating contact areas on the application board. By way of example, in the illustrations c in FIG. 8 and e in FIG. 9, the sections 1a, 11a are not required as contact pads.

A further aspect relates to the use of a flexible chip carrier instead of the leadframe 1, 11. A flexible chip carrier may be formed as a multilayer structure comprising at least one plastic layer (for example polyimide) and a metallization layer lying above the latter. The plastic layer may be approximately 100 μm thick, by way of example, and the thickness of the metallization layer may lie e.g. within the range of 5 to 20 μm. Structures having a plurality of metallization layers are likewise possible. Flexible chip carriers are also known by the expressions flexible substrates or flexible printed circuit boards.

Figure 11:
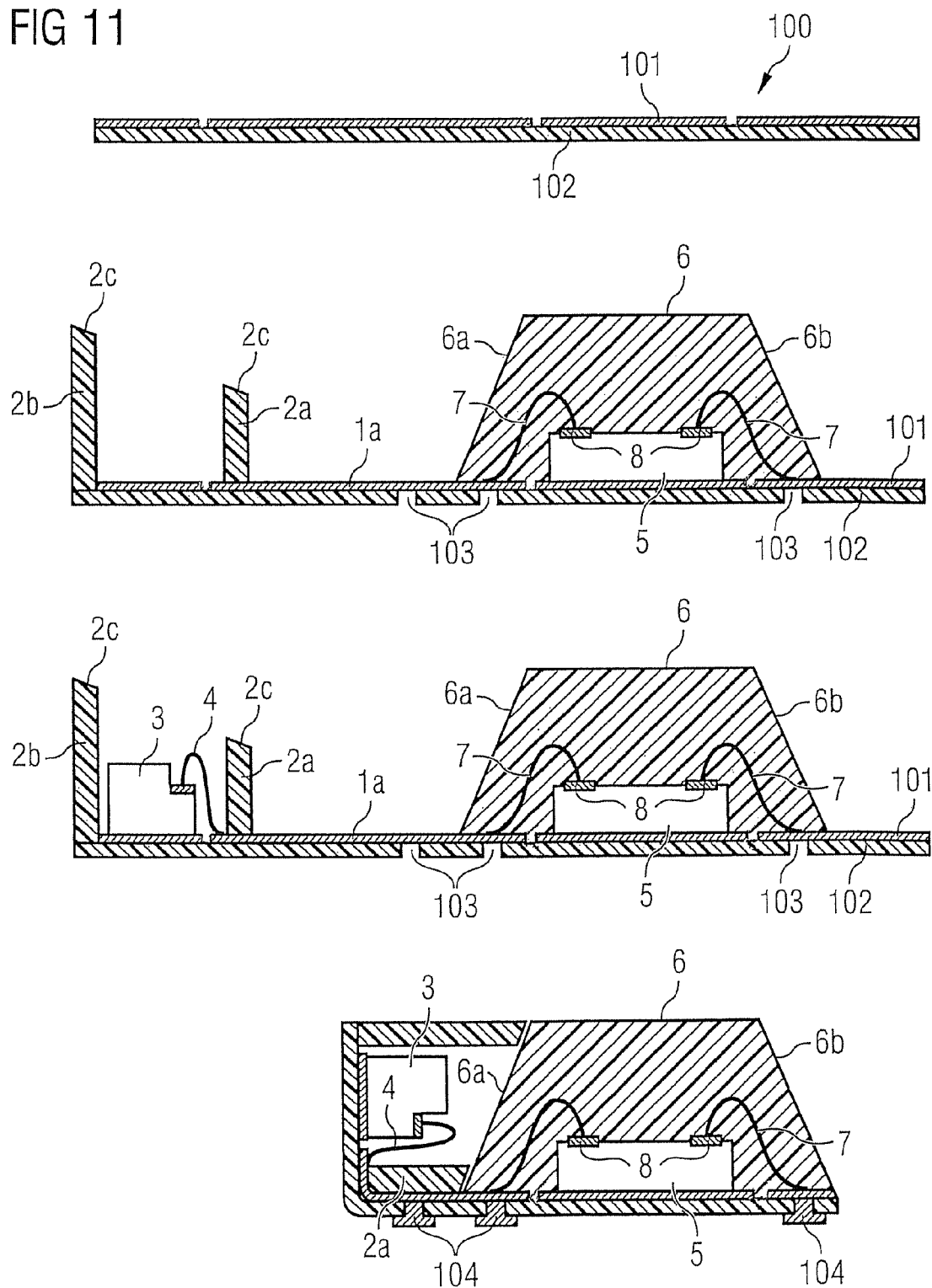
FIG. 11 illustrates schematic sectional illustrations of a further sensor chip module in different process steps of production.

FIG. 11 shows, by way of example for the exemplary embodiment shown in FIG. 4, illustrations of a production sequence of a sensor chip module with a flexible chip carrier 100 instead of a leadframe 1. All of the sensor chip modules in accordance with the exemplary embodiments already described can be equipped with a flexible chip carrier 100 instead of the leadframe 1, 11 in an analogous manner.

The flexible chip carrier 100 has a metallization layer 101, which is applied on a plastic carrier layer 102. The metallization layer 101 is patterned in order to form conductor paths. By way of example, photolithographic methods may be used for the patterning of the metallization layer 101.

The sensor chip hollow housing 2 and the semiconductor chip housing 6 are fitted to the flexible chip carrier 100. This may be effected by injection moulding in an injection mould in the manner already described. In this case, the flexible chip carrier 100, in the injection mould, may bear on walls of the two injection-moulding cavities in such a way that it is backed by injection moulding and not encapsulated by injection moulding. As a result, the plastic carrier layer 102 remains uncovered on the rear side even in the region of the housings 2, 6.

The folding-over step for the orientation of the sensor chip housing 2 is made possible by the flexibility of the flexible chip carrier 100.

In the plastic carrier layer 102, plated-through holes 103 are provided at suitable locations, which holes are introduced, in a manner that is not illustrated, either as early as on the flexible chip carrier 100 that has not yet been backed by injection moulding, or during any desired later point in time in the production sequence (e.g. on one of the products illustrated in FIG. 11). The plated-through holes 103 are filled with through-plating metallizations 104 which form external contact areas for the mounting of the sensor chip module on an application board (not illustrated). The module bottom facing the application board is formed here by the flexible chip carrier 100 running in the mounting plane. It is advantageous that the position of external contact areas can be chosen freely on account of the possibility of the signal distribution through the patterned metallization layer over the entire bottom of the module. Further possible features of sensor chip modules that utilize a flexible chip carrier 100 emerge analogously from FIGS. 1 to 10, it being possible, in particular, also to form the exemplary embodiment illustrated in FIG. 1 without a semiconductor chip housing 6 (i.e. the sensor chip module is realized solely by the sensor chip hollow housing 2 in FIG. 1) with a flexible chip carrier 100.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A module, comprising:
   a first semiconductor chip having an active surface, which is accommodated in a first housing made of plastic;
   a second semiconductor chip having an active surface, which is accommodated in a second housing made of plastic; and
   a common chip carrier made in one piece, on which the first semiconductor chip and the second semiconductor chip are mounted, the common chip carrier being configured to electrically contact the first and second semiconductor chips;
   wherein the two housings are joined together to contact each other and form a common module housing and the chip carrier is bent in such a way that the active surface of the first semiconductor chip is inclined with respect to the active surface of the second semiconductor chip;
   wherein the first housing is a hollow housing and an opening of the first hollow housing is closed off by a wall of the second housing.

2. The module according to claim 1, wherein the first semiconductor chip is a sensor chip and/or an optical chip.

3. The module according to claim 1, wherein the chip carrier is a metallic leadframe carrier.

4. The module according to claim 1, wherein the chip carrier is a flexible plastic carrier with conductors metallized thereon.

5. The module according to claim 1, wherein the second semiconductor chip has a signal evaluation circuit for the signal evaluation of signals of the first semiconductor chip and/or a driver circuit for driving the first semiconductor chip and/or a logic circuit.

6. The module according to claim 1, wherein
the common module housing defines a mounting plane of the module, and
the active surface of the first semiconductor chip is inclined with respect of the mounting plane.

7. The module according to claim 1, wherein
the first housing has an interior space that is filled with a potting composition, wherein the potting composition is made of a different material than the first housing.

8. The module according to claim 1, wherein
the second housing is a plastic injection-molding housing realized by encapsulation of the second semiconductor chip.

9. The module according to claim 1, wherein
the common chip carrier extends along an outer wall of the first housing.

10. The module according to claim 9, wherein
the common chip carrier forms an external contact-connection section at the outer wall of the first chip housing.

11. The module according to claim 1, wherein
the opening of the first hollow housing is closed off by a side wall of the second housing.

12. A module, comprising:
a first semiconductor chip having an active surface, which is accommodated in a first housing;
a second semiconductor chip having an active surface, which is accommodated in a second housing; and
a common chip carrier made in one piece, on which the first semiconductor chip and the second semiconductor chip are mounted, the common chip carrier being configured to electrically contact the first and second semiconductor chips;
wherein the two housings are joined together to form a common module housing and the chip carrier is bent in such a way that the active surface of the first semiconductor chip is inclined with respect to the active surface of the second semiconductor chip;
wherein the second housing is a plastic injection-molding housing realized by encapsulation of the second semiconductor chip; and
wherein the first housing is a hollow housing and an opening of the first hollow housing is closed off by a wall of the second housing.

13. A module, comprising:
a first semiconductor chip having an active surface, which is accommodated in a first housing;
a second semiconductor chip having an active surface, which is accommodated in a second housing; and
a common chip carrier made in one piece, on which the first semiconductor chip and the second semiconductor chip are mounted, the common chip carrier being configured to electrically contact the first and second semiconductor chips;
wherein the two housings are joined together to form a common module housing and the chip carrier is bent in such a way that the active surface of the first semiconductor chip is inclined with respect to the active surface of the second semiconductor chip;
wherein the second housing is a plastic injection-molding housing realized by encapsulation of the second semiconductor chip; and
wherein the opening of the first hollow housing is closed off by a side wall of the second housing.

* * * * *